United States Patent
Wada et al.

(10) Patent No.: US 7,243,410 B2
(45) Date of Patent: Jul. 17, 2007

(54) METHOD FOR MANUFACTURING A PROBE CARD

(75) Inventors: Koichi Wada, Tokyo (JP); Yasuhiro Maeda, Tokyo (JP)

(73) Assignee: Advantest Corporation, Tokyo (JP)

( * ) Notice: Subject to any disclaimer, the term of this patent is extended or adjusted under 35 U.S.C. 154(b) by 466 days.

(21) Appl. No.: 10/771,876

(22) Filed: Feb. 4, 2004

(65) Prior Publication Data

US 2004/0155009 A1 Aug. 12, 2004

Related U.S. Application Data

(63) Continuation of application No. PCT/JP02/08049, filed on Aug. 7, 2002.

(30) Foreign Application Priority Data

Aug. 10, 2001 (JP) ............................. 2001-243407

(51) Int. Cl.
*H01S 4/00* (2006.01)
(52) U.S. Cl. .................. 29/592.1; 29/831; 29/832; 29/842; 29/846; 29/854; 29/874; 216/13; 174/250; 174/260; 174/261; 324/754; 324/755; 324/757; 324/758; 324/761; 361/822; 439/55
(58) Field of Classification Search .............. 29/592.1, 29/831, 832, 842, 846, 854, 874, 884; 216/13; 324/754, 755, 757, 758, 761, 762, 765; 174/250, 174/260, 261, 262; 361/822; 439/55
See application file for complete search history.

(56) References Cited

U.S. PATENT DOCUMENTS 5,166,774 A * 11/1992 Banerji et al. ............. 361/749

| 5,434,453 | A | * | 7/1995 | Yamamoto et al. | ......... 257/777 |
| 5,510,758 | A | * | 4/1996 | Fujita et al. | ............... 333/247 |

FOREIGN PATENT DOCUMENTS

| JP | 02054985 A | * 2/1990 |
| JP | 6-241781 | 9/1994 |
| JP | 11-230707 | 8/1999 |

OTHER PUBLICATIONS

Patent Abstracts of Japan, Publication No. 11-230707 dated Aug. 27, 1999, 1 pg.
Patent Abstracts of Japan, Publication No. 06-241781 dated Sep. 2, 1994, 1 pg.
International Search Report issued in PCT/JP02/08049 mailed on Nov. 26, 2002, 2 pgs.

* cited by examiner

*Primary Examiner*—Paul D Kim
(74) *Attorney, Agent, or Firm*—Osha Liang LLP

(57) ABSTRACT

A method for manufacturing a probe card includes a first contact formation step of forming a first contact on a first surface of a first sacrificial substrate, a second contact formation step of forming a second contact on a first surface of a second sacrificial substrate, a signal transmission line formation step of forming a signal transmission line in the base substrate, a first contact joining step of attaching the first surface of the first sacrificial substrate to the base substrate and joining the first contact to the signal transmission line, and a second contact joining step of attaching the first surface of the second sacrificial substrate to the base substrate and joining the second contact to the signal transmission line.

12 Claims, 9 Drawing Sheets (PLAN VIEW)

(CROSS-SECTIONAL VIEW)

(PLAN VIEW)

(CROSS-SECTIONAL VIEW)

(CROSS-SECTIONAL VIEW)

(CROSS-SECTIONAL VIEW)

(PLAN VIEW)

(PLAN VIEW)

(CROSS-SECTIONAL VIEW)

(CROSS-SECTIONAL VIEW)

(PLAN VIEW)

(CROSS-SECTIONAL VIEW)

(CROSS-SECTIONAL VIEW)

FIRST PROCESS

SECOND PROCESS

THIRD PROCESS

METHOD FOR MANUFACTURING A PROBE CARD

The present application is a continuation application of PCT/JP02/08049 filed on Aug. 7, 2002 which claims priority from a Japanese Patent Application No. 2001-243407 filed on Aug. 10, 2001, the contents of which are incorporated herein by reference.

BACKGROUND OF THE INVENTION

1. Field of the Invention

The present invention relates to a method for manufacturing a probe card.

2. Related Art

In the recent trend of making the pitch of electrodes of an electronic device narrow, a demand for miniaturizing the probe pins of a probe card provided in a testing apparatus for testing the electronic device with high precision has also been increasing. As conventional minute probe pins, the membrane type probe pins are known.

The membrane type probe pins, however, have a problem that they are liable to be deformed because of being in contact with the electronic device. Accordingly, it is difficult to provide a probe card having minute probe pins with high precision.

SUMMARY OF THE INVENTION

Therefore, it is an object of the present invention to provide a method for manufacturing a probe card, which is capable of overcoming the above drawbacks accompanying the conventional art. The above and other objects can be achieved by combinations described in the independent claims. The dependent claims define further advantageous and exemplary combinations of the present invention.

In order to solve the problems above, according to the first aspect of the present invention, a method for manufacturing a probe card, which includes a contact provided on a base substrate and electrically coupled to a terminal of an electronic device, for receiving and/or sending a signal from and/or to the electronic device, includes a first contact formation step of forming a first contact of the contacts on a first surface of a first sacrificial substrate, a second contact formation step of forming a second contact of the contacts of a first surface of a second sacrificial substrate, a signal transmission line formation step of forming a signal transmission line in the base substrate, a first contact joining step of attaching the first surface of the first sacrificial substrate to the base substrate and joining the first contact to the signal transmission line and a second contact joining step of attaching the first surface of the second sacrificial substrate to the base substrate and joining the second contact to the signal transmission line.

The method for manufacturing a probe card may further include a first sacrificial substrate elimination step of eliminating the first sacrificial substrate after the first contact is coupled to the signal transmission line in the first contact joining step, wherein after the first sacrificial substrate is eliminated in the first sacrificial substrate elimination step, the first surface of the second sacrificial substrate may be attached to the base substrate and the second contact may be joined to the signal transmission line in the second contact joining step.

The first contact formation step includes the steps of forming a first penetration hole in the first sacrificial substrate and forming first one of the first contacts in order that a first end of the first one of the first contacts is fixed to the first surface of the first sacrificial substrate and a second end of the first one of the first contacts is bent in a direction toward a second surface opposite to the first surface of the first sacrificial substrate to be held freely within the first penetration hole.

The first contact formation step includes a step of forming a second one of the first contacts in order that a first end of the second one of the first contacts is fixed to the first surface of the first sacrificial substrate at a position facing the first one of the first contacts to the first penetration hole and a second end of the second one of the first contacts is bent in the direction toward the second surface of the first sacrificial substrate to be held freely within the first penetration hole.

The first contact formation step includes a step of forming the first and second ones of the first contacts to be substantially symmetrical at two facing sides of the first penetration hole formed in a rectangular shape respectively.

The first contact formation step includes a step of forming a plurality of the first contacts at each of four sides of the first penetration hole formed in a rectangular shape.

The second contact formation step includes the steps of forming a second penetration hole which is larger than an area of the first sacrificial substrate in which the first contact is placed and forming the second contact in order that a first end of the second contact is fixed to the first surface of the second sacrificial substrate and a second end of the second contact is bent in a direction toward a second surface opposite to the first surface of the second sacrificial substrate to be held freely within the second penetration hole, and the second joining step includes a step of attaching the first surface of the second sacrificial substrate to the base substrate in order that the first contact coupled with the signal transmission line is placed within the second penetration hole and joining the second contact to the signal transmission line.

According to the second aspect of the present invention, a method for manufacturing a probe card, which includes a contact provided on a base substrate and electrically coupled to a terminal of an electronic device, for receiving and/or sending a signal from and/or to the electronic device, includes a penetration hole formation step of forming a penetration hole in a sacrificial substrate, a first contact formation step of forming first one of the contacts in order that a first end of the first one of the contacts is fixed to a first surface of the sacrificial substrate and a second end of the first one of the contacts is bent in a direction toward a second surface opposite to the first surface of the sacrificial substrate to be held freely within the penetration hole, a second contact formation step of forming second one of the contacts in order that a first end of the second one of the contacts is fixed to the first surface of the sacrificial substrate at a position facing the first one of the contacts to the penetration hole and a second end of the second one of the contacts is bent in the direction toward the second surface of the sacrificial substrate to be held freely within the penetration hole, a signal transmission line formation step of forming a signal transmission line in the base substrate and a contact joining step of attaching the first surface of the sacrificial substrate to the base substrate and joining the first and second ones of the contacts to the signal transmission line.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
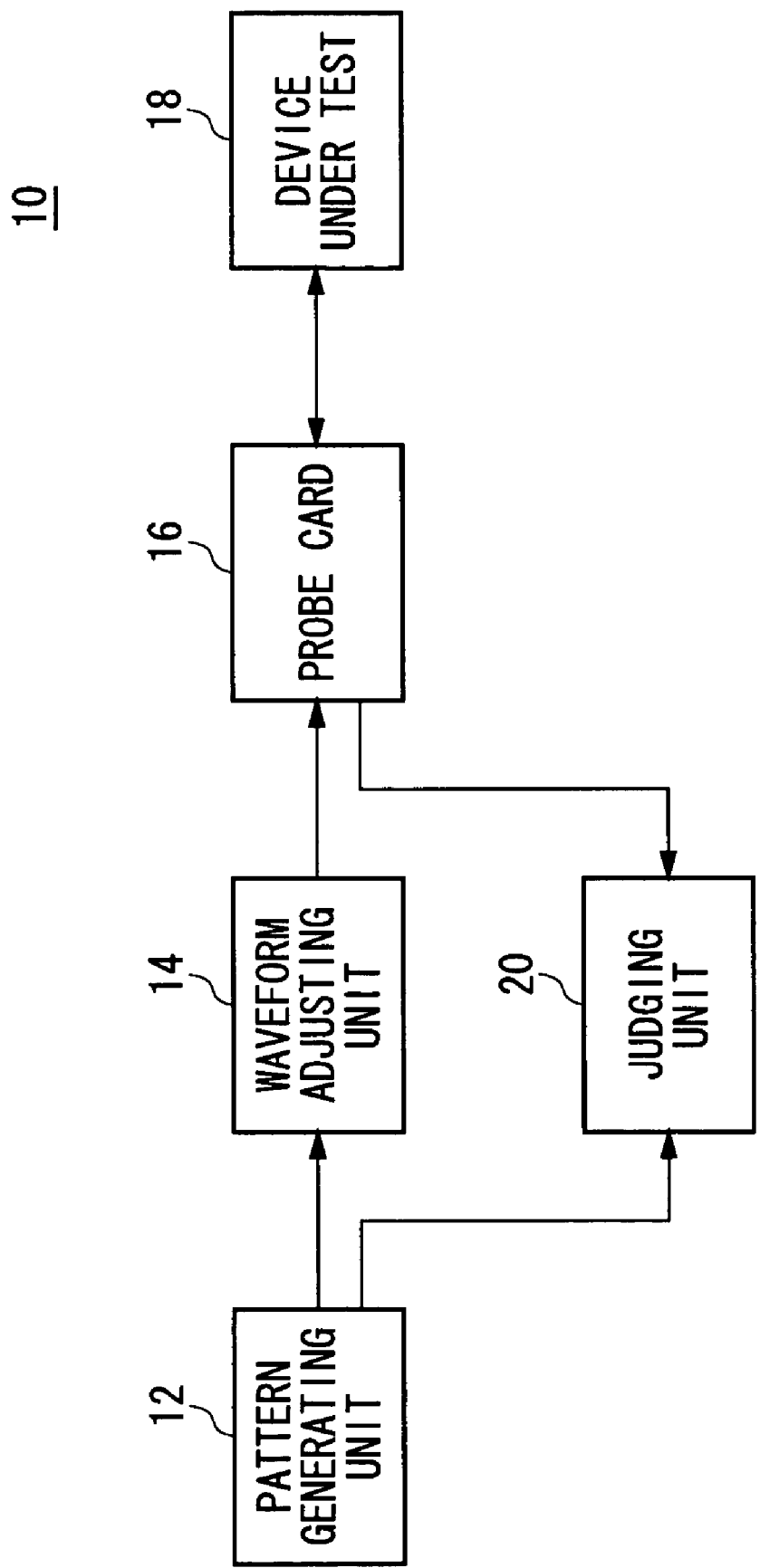
FIG. 1 shows an example of the configuration of the semiconductor testing apparatus.

FIG. 1 shows an example of the configuration of a semiconductor testing apparatus 10 according to an exemplary embodiment of the present invention. The semiconductor testing apparatus 10 includes a pattern generating unit 12, a waveform adjusting unit 14, a probe card 16 and a judging unit 20.

The pattern generating unit 12 generates test signals to test a device under test 18 that is an electronic device and supplies them to the waveform adjusting unit 14.

The waveform adjusting unit 14 adjusts the test signals generated by the pattern generating unit 12 and supplies the adjusted test signals to the probe card 16. The waveform adjusting unit 14 may supply the test signals to the probe card 16 at desired timing. In this case, the waveform adjusting unit 14 may include a timing generator for generating the desired timing. The timing generator may include a changeable delay circuit so that it can supply the desired timing to the waveform adjusting unit 14 by receiving a reference clock to control the operation of the semiconductor testing apparatus 10 and delaying the received reference clock as much as the desired time using the changeable delay circuit.

The probe card 16 is coupled to a plurality of electrodes provided in the device under test 18 electrically and receives and/or sends signals from and/or to the device under test 18. Particularly, the probe card 16 supplies the test signals to the device under test 18. In addition, the probe card 16 receives output signals outputted by the device under test 18 based on the test signals and supplies the received output signals to the judging unit 20.

The judging unit 20 judges the quality of the device under test 18 based on the output signals outputted by the device under test 18 based on the test signals. The judging unit 20 may judge the quality of the device under test 18 by, e.g. comparing the output signals outputted by the device under test 18 with expected signals supposed to be outputted by the device under test 18 based on the test signals. In this case, the pattern generating unit 12 may generate the expected signals based on the generated test signals to supply them to the judging unit 20.

FIGS. 2 to 4 show a method for manufacturing a probe card 16 according to the first embodiment.

Figure 2A:
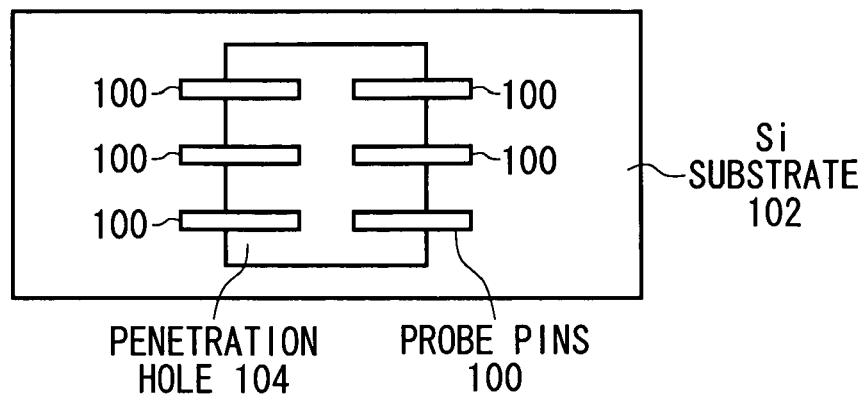
FIGS. 2A and 2B are a plan view and a cross-sectional view, respectively, showing a first step of a method for manufacturing a probe card 16 according to a first embodiment.
Figure 2B:
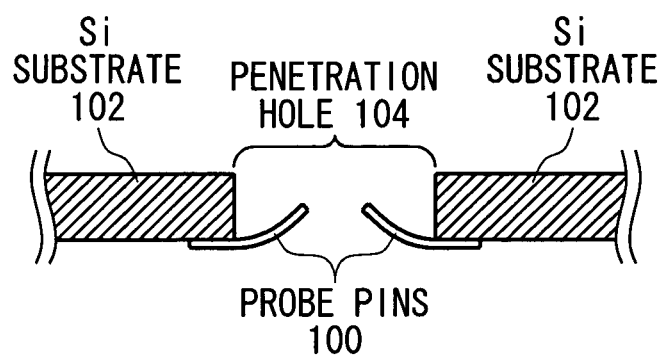

FIG. 2 shows a first step of the method for manufacturing a probe card 16 according to the first embodiment. FIG. 2A is a plan view showing the first step, and FIG. 2B is a cross-sectional view showing the first step.

The first step includes a penetration hole formation step of forming a penetration hole 104 in a Si substrate 102 that is an example of a sacrificial substrate and a contact formation step of forming probe pins 100 that are an example of the contacts. FIGS. 2A and 2B show an example of forming six probe pins 100.

A mask layer of a desired shape to form the probe pins 100 is first formed on a first surface of the Si substrate 102. The mask layer is, e.g. silicon oxide, silicon nitride or the like. And, taking the mask layer as a mask, a conductive material is deposited on the Si substrate 102 to form the probe pins 100. For example, the probe pins 100 are formed by using a physical vapor deposition such as the sputtering method, the vacuum vapor deposition or the like.

Then, after eliminating the mask layer, a mask layer of a desired shape to form the penetration hole 104 on a second surface of the Si substrate 102 opposite to the first surface. And, taking the mask layer as a mask, a part of the Si substrate 102 is eliminated by, e.g. etching to form the penetration hole 104. Particularly, the penetration hole 104 of a rectangular shape is formed in order that first ends of a plurality of the probe pins 100 are fixed to the Si substrate 102 while second ends of them are free. In addition, the penetration hole 104 of a rectangular shape may be formed in order that a pair of probe pins 100, which are adjacent to each other in a longitudinal direction, are substantially symmetrical to the penetration hole 104.

And, first one of the probe pins 100 is formed in order that a first end of it is fixed to the first surface of the Si substrate 102 while a second end of it is bent in a direction from the first surface to the second surface of the Si substrate 102 to be freely held in the penetration hole 104.

In addition, second one of the probe pins 100 is formed in order that a first end of it is fixed to the first surface of the Si substrate 102 at a position facing the first one of the probe pins 100 against the penetration hole 104 while a second end of it is bent in a direction from the first surface to the second surface of the Si substrate 102 to be freely held in the penetration hole 104. As a method of bending the probe pins 100, the second end of one of the probe pins 100 may be bent by, e.g. pressing it in a direction from the first surface to the second surface or changing temperature after forming the probe pins 100 of a bimorph structure.

Further, the probe pins 100 that are probes coupled to terminals of the device under test 18 electrically are formed to have elasticity due to their bent shape (a lead shape).

Moreover, a plurality of probe pins 100 is formed on the Si substrate in order to correspond to the contact arrangement of the probe card 16. In addition, the Si substrate 102 is a structure for holding the position of the plurality of probe pins 100, where the plurality of probe pins 100 is formed at a precise position, and the plurality of probe pins 100 is eliminated by etching or mechanical peeling after it is joined and fixed to a predetermined position of the probe card 16. Moreover, the penetration hole 104 is provided for accepting the probe pins 100 with a bent shape in the Si substrate 102, so that the probe pins 100 can be prevented from being broken.

Figure 3A:
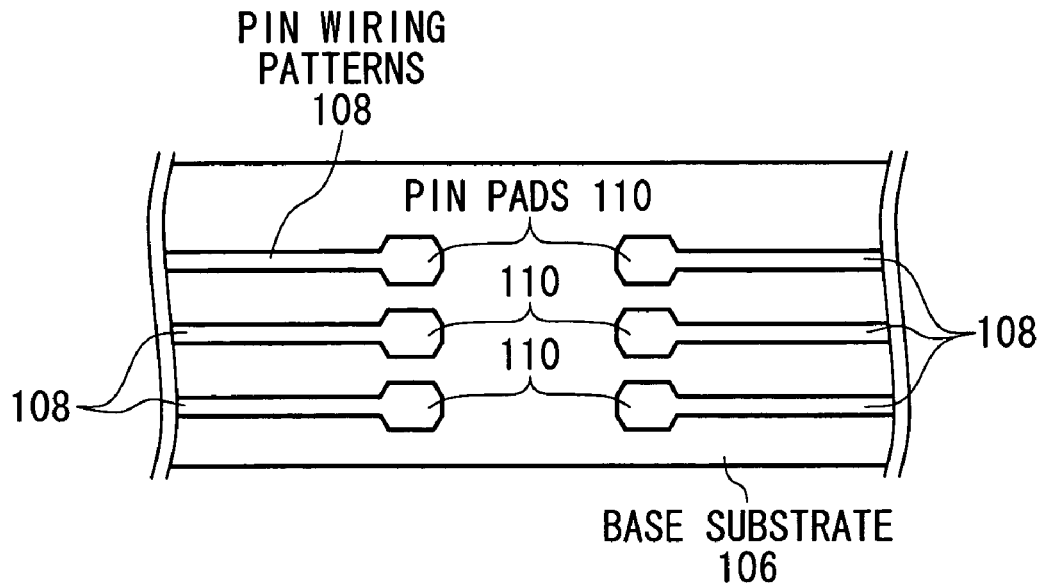
FIGS. 3A and 3B are a plan view and a cross-sectional view, respectively, showing a second step of a method for manufacturing a probe card 16 according to the first embodiment.
Figure 3B:
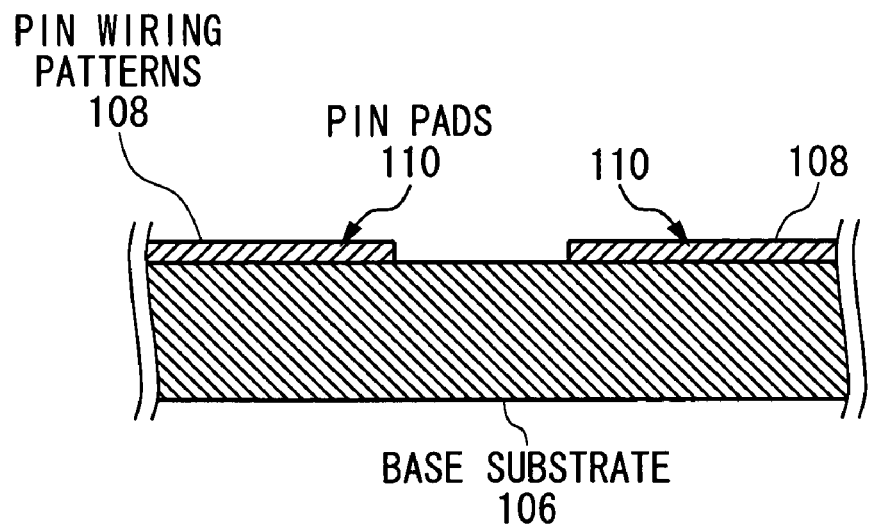

FIG. 3 shows a second step of the method for manufacturing the probe card 16 according to the first embodiment. FIG. 3A is a plan view showing the second step, and FIG. 3B is a cross-sectional view showing the second step.

The second step includes a signal transmission line formation step of forming signal transmission lines including pin wiring patterns 108 and pin pads 110 on a base substrate 106. FIGS. 3A and 3B show an example of forming six pin wiring patterns 108 and six pin pads 110.

A mask layer of a desired shape to form the pin wiring patterns 108 and the pin pads 110 is first formed on a surface of the base substrate 106. The mask layer is, e.g. silicon oxide, silicon nitride or the like. And, taking the mask layer as a mask, a conductive material is deposited on the Si substrate 102 to form the pin wiring patterns 108 and the pin pads 110. For example, the pin wiring patterns 108 and the pin pads 110 are formed by using a physical vapor deposition such as the sputtering method, the vacuum vapor deposition or the like or by plating such as electroplating, chemical plating or the like.

Further, the base substrate 106 that is a body structure of the probe card 16 is a circuit board to perform signal transmission from and/or to the device under test 18 and the testing apparatus 10. External terminals or contacts electrically coupled to the device under test 18 and the testing apparatus 10 are manufactured to correspond to the contact arrangement of the device under test 18, having wirings patterned to correspond to each of the plurality of probe pins 100 one to one. For example, a probe card 16 for measuring 64 pieces of device under test 18 having 40 pin terminals at the same time includes thousands of probe pins 100. In addition, 6 pin pads 110 are electrode pads coupled to corresponding root parts of 6 probe pins 100 electrically and/or mechanically. Moreover, 6 pin wiring patterns 108 are wiring patterns for allowing the 6 pin pads 110 and the corresponding external terminals or contacts to be coupled with each other electrically and/or mechanically.

Figure 4A:
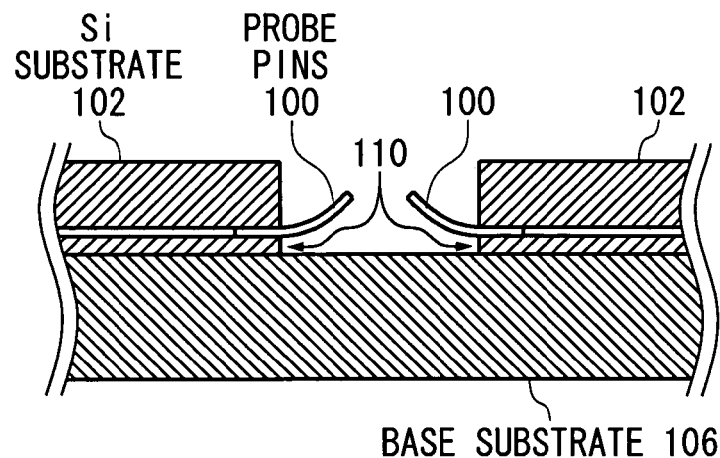
FIGS. 4A, 4B and 4C are a cross-sectional view, a cross-sectional view and a plan view, respectively, showing a third step of a method for manufacturing a probe card 16 according to the first embodiment.
Figure 4B:
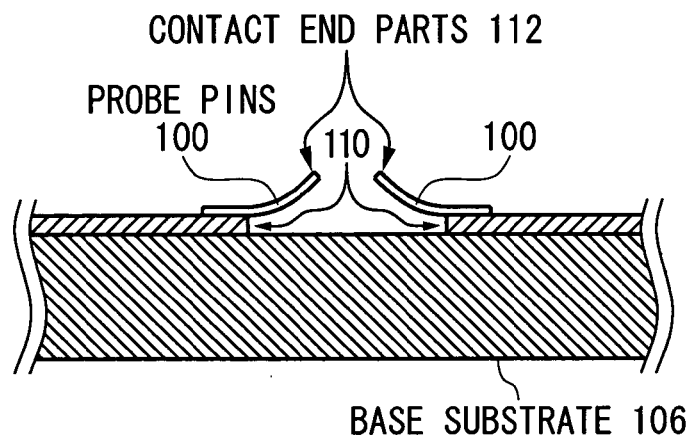
Figure 4C:
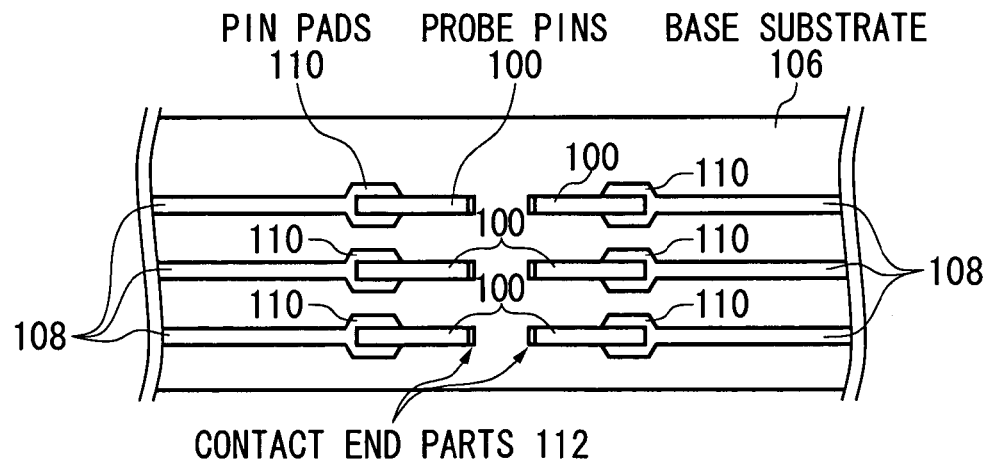

FIG. 4 shows a third step of the method for manufacturing the probe card 16 according to the first embodiment. FIGS. 4A and 4B are cross-sectional views showing the third step, and FIG. 4C is a plan view showing the third step.

The third step includes a contact joining step of joining the plurality of probe pins 100 to the pin pads 110 by attaching the first surface of the Si substrate 102 to the base substrate 106.

First, as shown in FIG. 4A, the first ends (the root parts) of the 6 probe pins 100 fixed on the first surface of the Si substrate 102 and the 6 pin pads 110 formed on the corresponding base substrate 106 are positioned and joined each other electrically and/or mechanically. And, as shown in FIG. 4B, the Si substrate 102 joined with the probe pins 100 is eliminated by etching or mechanical peeling.

By the first to third steps shown in FIGS. 2 to 4, a probe card 16 realizing desired contact arrangement is completely made. The probe card 16 is mounted to, e.g. a prober apparatus, and the testing apparatus 10 performs the electrical test of the device under test 18 via the probe card 16. At this time, the contact end parts 112 of the second ends of the probe pins 100 are pressed to be in contact with the terminals of the device under test 18 so that they can be coupled to the terminals electrically.

Figure 5A:
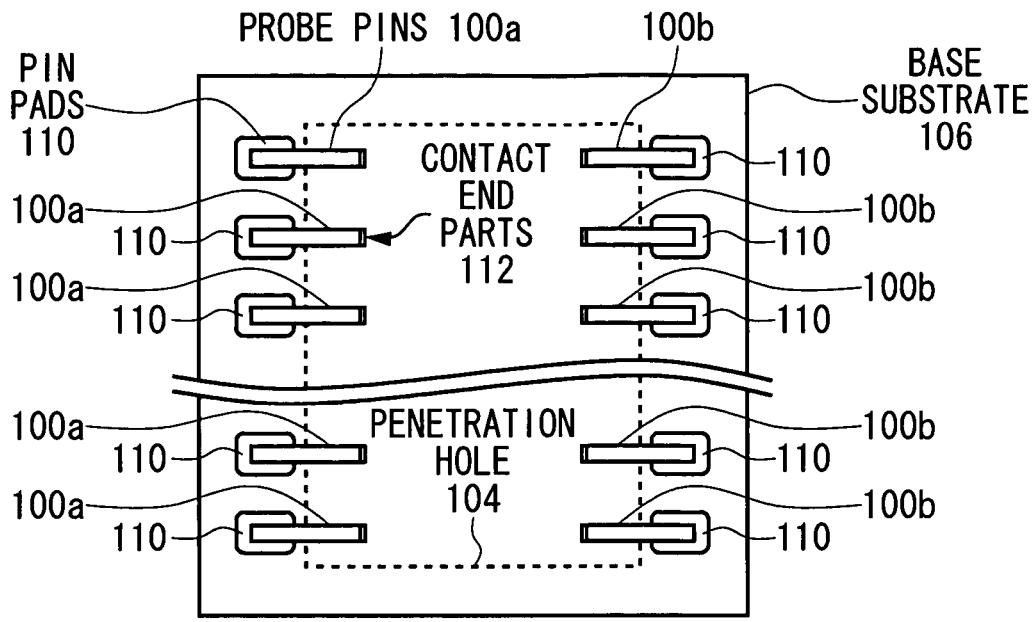
FIGS. 5A and 5B show examples of a contact arrangement of the configuration of a probe card manufactured by the method of the first embodiment.
Figure 5B:
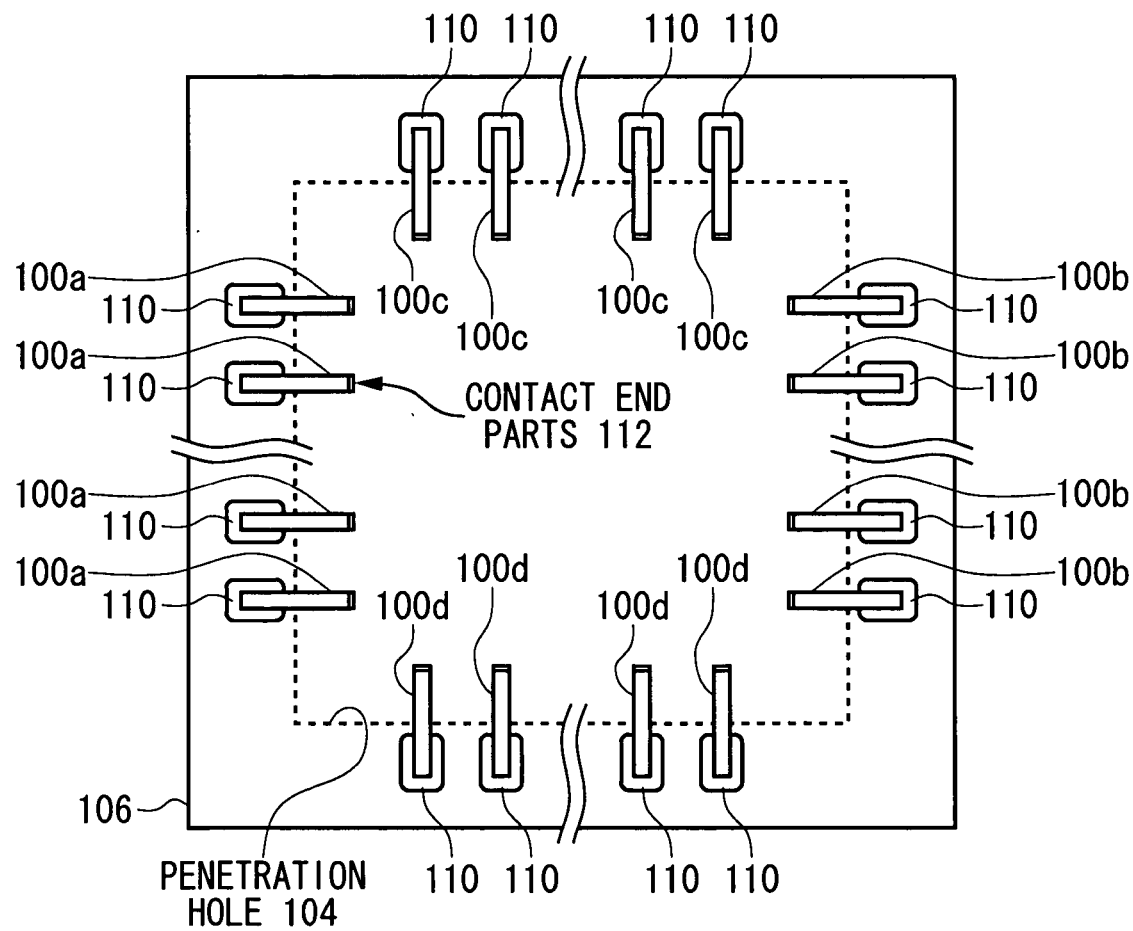

FIG. 5 shows the configuration of the probe card 16 manufactured by the method of the first embodiment. FIGS. 5A and 5B show two examples whose contact arrangement is different. The probe card 16 of the first embodiment shown in FIG. 5A includes a plurality of probe pins 100a and 100b, where the plurality of probe pins 100a extending in a predetermined direction while arranged in a direction substantially perpendicular to the extension direction and the plurality of probe pins 100b extending in a direction opposite to the predetermined direction while arranged in a direction substantially perpendicular to the extension direction are formed substantially symmetrically. In other words, the probe pins 100a extending in the predetermined direction and the probe pins 100b extending in the direction opposite to the predetermined direction are formed facing each other. The probe card 16 of the first embodiment shown in FIG. 5B includes a plurality of probe pins 100a, 100b, 100c and 100d, where the plurality of probe pins 100a extending in a first direction while arranged in a direction substantially perpendicular to the extension direction and the plurality of probe pins 100b extending in a second direction opposite to the first direction while arranged in a direction substantially perpendicular to the extension direction are formed substantially symmetrically, and the plurality of probe pins 100c extending in a third direction substantially perpendicular to the first direction while arranged in a direction substantially perpendicular to the extension direction and the plurality of probe pins 100d extending in a fourth direction opposite to the third direction while arranged in a direction substantially perpendicular to the extension direction are formed substantially symmetrically. In other words, the probe pins 100a extending in the first direction and the probe pins 100b extending in the second direction and the probe pins 100c extending in the third direction and the probe pins 100c extending in the fourth direction are formed facing each other respectively.

In the process of manufacturing the probe card 16 as above, the penetration hole 104 of a rectangular shape is formed on the Si substrate 102, and the probe pins 100 are formed at two or four corresponding sides of the penetration hole 104 respectively. And, since the probe pins 100 are joined to the pin pads 110 of the base substrate 106 after attaching the Si substrate 102 to the base substrate 106, all of the probe pins 100 can be joined and formed in one stroke.

In addition, since the plurality of probe pins 100 is formed substantially symmetrically to the Si substrate 102, the Si substrate 102 is controlled not to be shaky when attaching the Si substrate 102 to the base substrate 106, so that the Si substrate 102 and the base substrate 106 can be positioned with stability. Therefore, the probe pins 100 and the pin pads 110 can be positioned with high precision.

Figure 6A:
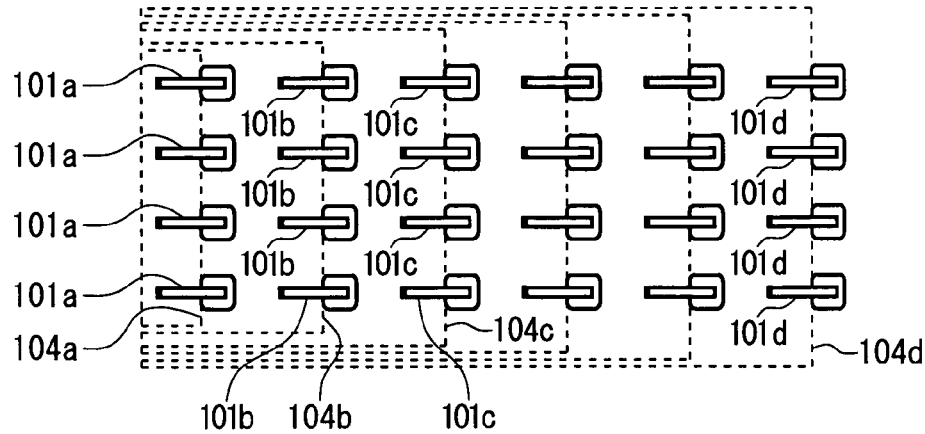
FIGS. 6A, 6B and 6C are a plan view, a cross-sectional view and a cross-sectional view, respectively, showing the configuration of a probe card 16 and a method thereof according to a second embodiment.
Figure 6B:
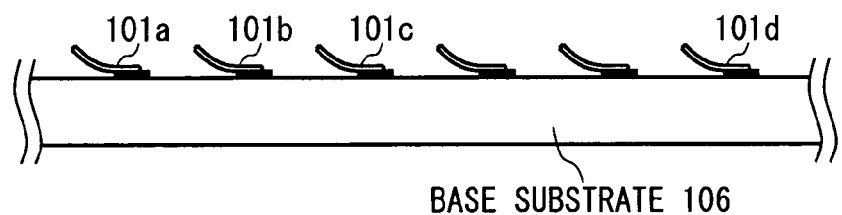
Figure 6C:
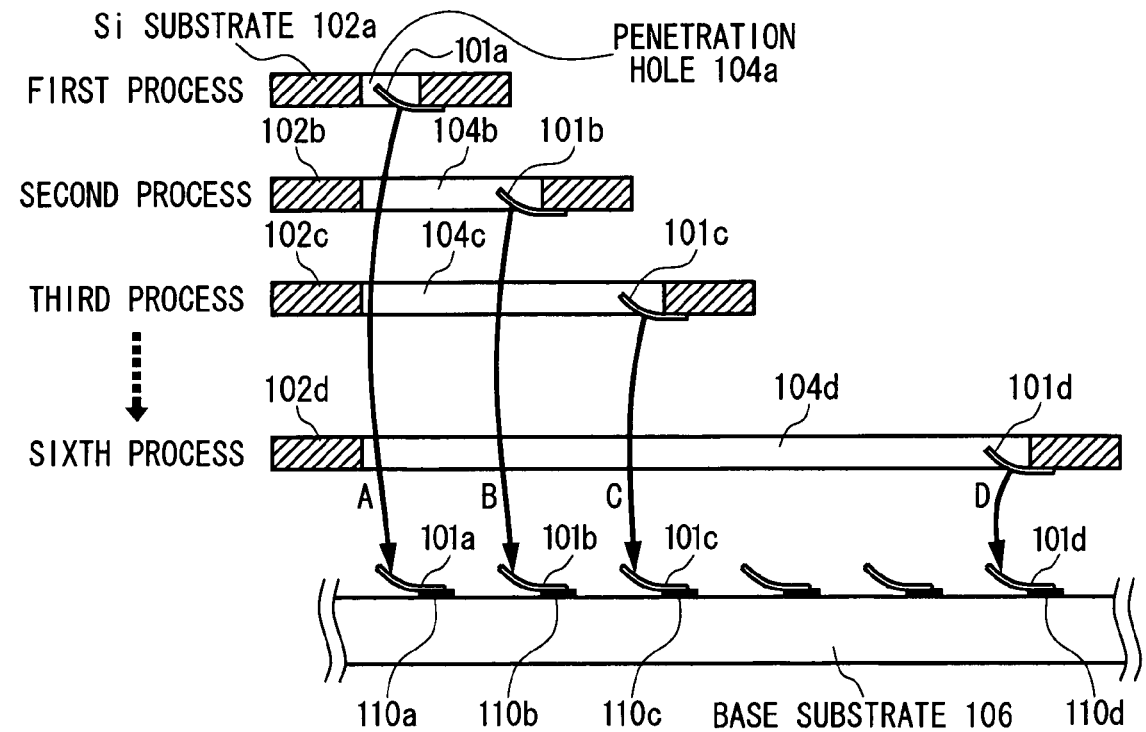

FIG. 6 shows the configuration of a probe card 16 and a method for manufacturing it according to a second embodiment. FIG. 6A is a plan view of the configuration of the probe card 16, FIG. 6B is a cross-sectional view of the configuration of the probe card 16 and FIG. 6C is a cross-sectional view showing the method for manufacturing the probe card 16.

As shown in shown in FIGS. 6A and 6B, the probe card 16 of the second embodiment includes a plurality of probe pins 101a, 101b, 101c and 101d arranged in a lattice shape on the base substrate 106. The probe pins 101a, 101b, 101c and 101d extend in a predetermined direction and are arranged along the extension direction. In addition, the probe pins 101a, 101b, 101c and 101d are arranged along a direction substantially perpendicular to the extension direction in a plurality of lines respectively. FIG. 6 shows an example in which the probe pins 101a, 101b, 101c and 101d are arranged in six columns and four rows with a narrow pitch.

Hereinafter, the method for manufacturing the probe card 16 according to the second embodiment will be described referring to FIGS. 6A, 6B and 6C.

Like the first step of the manufacture method shown in FIG. 2, a penetration hole 104a is first formed on a Si substrate 102a, and the probe pins 101a of the plurality of probe pins are formed on the first surface of the Si substrate 102a. At this time, the probe pins 101a are formed in order that first ends of them are fixed to the first surface of the Si substrate 102a while second ends of them are bent in a direction from the first surface to the second surface opposite to the first surface of the Si substrate 102a to be freely held in the penetration hole 104a. In the same way, a penetration hole 104b and the probe pins 101b are formed on a Si substrate 102b, a penetration hole 104c and the probe pins 101c are formed on a Si substrate 102c and a penetration hole 104d and the probe pins 101d are formed on a Si substrate 102d. In addition, like the second step of the manufacture method shown in FIG. 3, signal transmission lines having pin wiring patterns and pin pads are formed in the base substrate 106.

Further, a penetration hole 104b is formed to be larger than an area of the Si substrate 102a in which the probe pins 101a are placed. A penetration hole 104c is formed to be larger than an area that is an area of the Si substrate 102a, in which the probe pins 101a are placed, to which an area of the Si substrate 102b, in which the probe pins 101b are placed, is added.

In addition, a penetration hole 104b is formed to be larger than an area that is the area of the Si substrate 102a, in which the probe pins 101a are placed, and the area of the Si substrate 102b, in which the probe pins 101b are placed, to which an area of the Si substrate 102c, in which the probe pins 101c are placed, is added. In other words, the penetration hole is formed to be larger than the area of the Si substrate in which the probe pins are placed, wherein the Si substrate has already been used for joining the probe pins to the base substrate 106, before joining the probe pins to the base substrate 106 using the Si substrate on which the penetration hole has already been formed.

Then, like the third step of the manufacture method shown in FIG. 4, the first surface of the Si substrate 102a is attached to the base substrate 106, and the probe pins 101a are joined to the pin pads 110a. Then, after the probe pins 101a are joined to the pin pads 110a, the Si substrate 102a holding the probe pins 101a is eliminated by etching or mechanical peeling (first process). Then, after the Si substrate 102a is eliminated, the probe pins 101b are joined to the pin pads 101b by attaching the first surface of the Si substrate 102b to the base substrate 106 in order that the probe pins 101a joined with the pin pads 110a are placed within the penetration hole 104b. Then, after the probe pins 101b are joined to the pin pads 110b, the Si substrate 102b holding the probe pins 101b is eliminated by etching or mechanical peeling (second process). Then, after the Si substrate 102b is eliminated, the probe pins 101c are joined to the pin pads 110c by attaching the first surface of the Si substrate 102c to the base substrate 106 in order that the probe pins 101b joined with the pin pads 110b are placed within the penetration hole 104c. Then, after the probe pins 101c are joined to the pin pads 110c, the Si substrate 102c holding the probe pins 101c is eliminated by etching or mechanical peeling (third process). Repeating the same process until the sixth process, the probe pins 101a, 101b, 101c and 101d are joined to the pin pads 110a, 110b, 110c and 110d.

Further, the lengths of the Si substrates 102a, 102b, 102c and 102d in the extension direction of the probe pins 101a, 10b, 101c and 101d after the penetration holes 104a, 104b, 104c and 104d are formed respectively are preferably longer than the interval between the probe pins. Accordingly, the shape and strength of the Si substrates 102a, 102b, 102c and 102d can be maintained.

According to the method for manufacturing the probe card 16 as above, since the Si substrate can be attached to the base substrate 106 with stability so that the probe pins and the pin pads can be positioned with high precision, a probe card 16 whose the pitch between the probe pins is extremely narrow can be manufactured.

Figure 7:
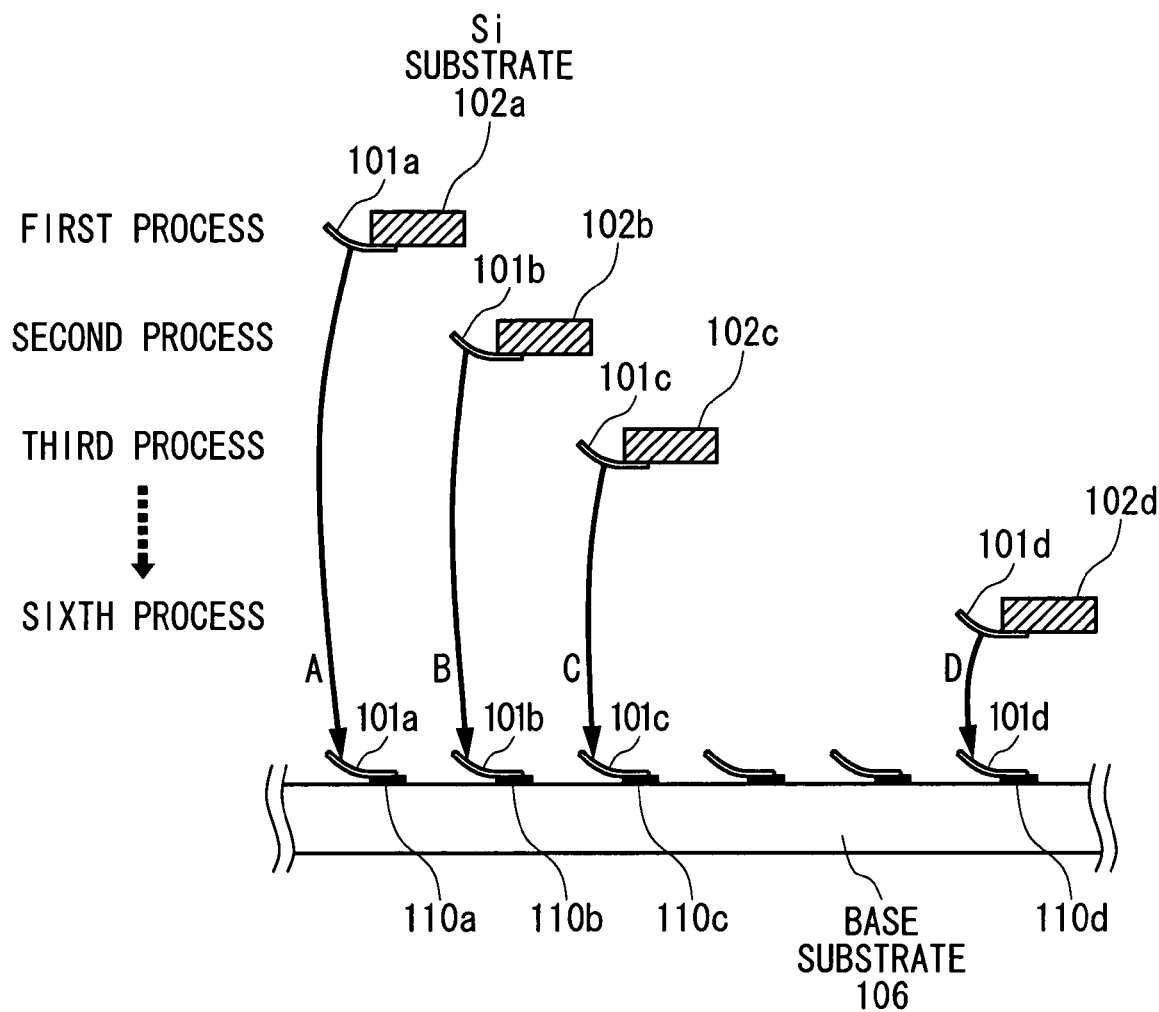
FIG. 7 shows another method for manufacturing a probe card 16 according to the second embodiment.

FIG. 7 shows another method for manufacturing a probe card 16 according to a second embodiment.

Although the penetration hole is formed on the Si substrate and the probe pins are formed to be held in the penetration hole in the method for manufacturing the probe card 16 described in relation to FIG. 6, the probe pins may be formed at end parts of the Si substrate. Hereinafter, the different part from the method for manufacturing the probe card 16 described in relation to FIG. 6 will be described mainly, and the description of the same part will be omitted partly.

A plurality of probe pins 101a is first formed on the first surface of the Si substrate 102a by depositing a conductive material. Then, a part of the Si substrate 102a on which first ends (root parts) of the probe pins 101a are placed is left while the other part of the Si substrate 102a is eliminated by etching or mechanical peeling in order that the first ends of the plurality of probe pins 101a are fixed to the Si substrate 102a and second ends of them are free. Then, the first ends are fixed to the first surface of the Si substrate 102a and the second ends are bent in a direction from the first surface to the second surface of the Si substrate 102a, so that the plurality of probe pins 101a can be formed to be held freely outside the Si substrate 102a. In addition, in the same way, the probe pins 101b, 101c and 101d are formed on the Si substrate 102b, 102c and 102d respectively. In addition, signal transmission lines having pin wiring patterns and pin pads are formed in the base substrate 106.

And, the first surface of the Si substrate 102a is attached to the base substrate 106, the probe pins 101a are joined to the pin pads 110a and the Si substrate 102a is eliminated by etching or mechanical peeling (first process). Then, in the same way, the probe pins 101b, 101c and 101d are joined to the pin pads 110b, 110c and 110d respectively (second, third and sixth processes).

According to the method for manufacturing the probe card 16 as above, since the amount of the Si substrate eliminated is small, the time for etching or mechanical peeling can be reduced.

Figure 8A:
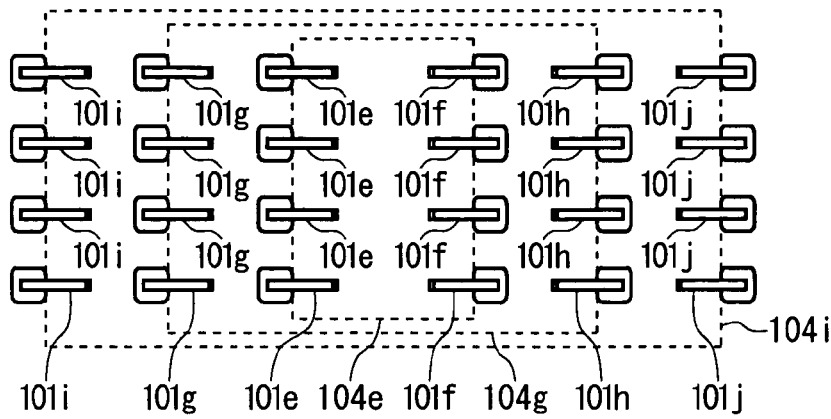
FIGS. 8A, 8B and 8C are a plan view, a cross-sectional view, and a cross-sectional view, respectively, showing the configuration of a probe card 16 and a method thereof according to a third embodiment.
Figure 8B:
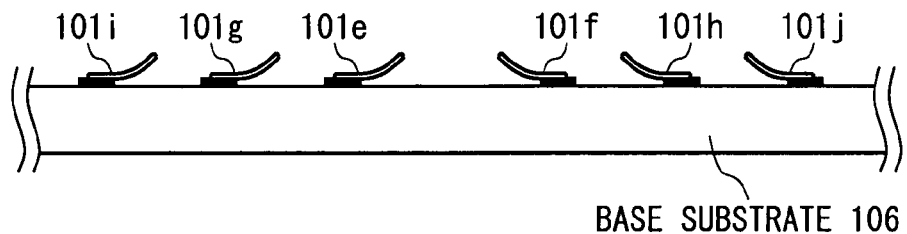

FIG. 8 shows the configuration of a probe card 16 and a method for manufacturing it according to a third embodiment. FIG. 8A is a plan view showing the configuration of the probe card 16, and FIGS. 8B and C are cross-sectional views showing the method for manufacturing the probe card 16.

Figure 8C:
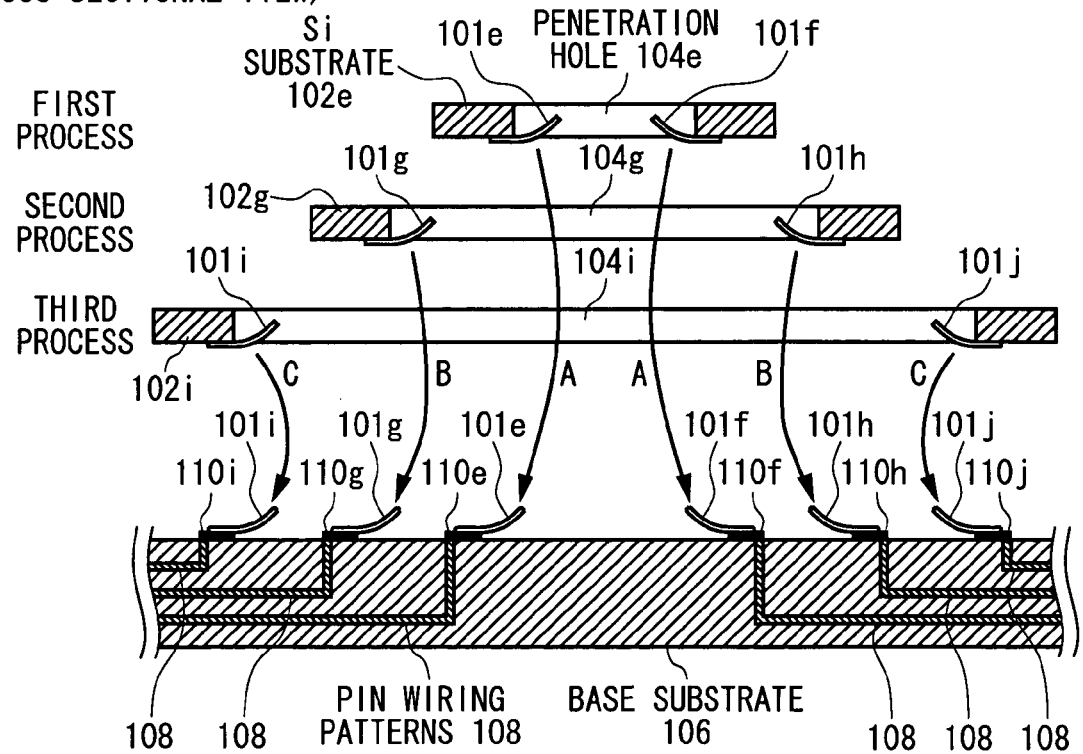

As shown in FIGS. 8A and 8C, the probe card 16 of the third embodiment includes a plurality of probe pins 101e, 101*f*, 101*g*, 101*h*, 101*i* and 101*j* arranged in a lattice shape on the base substrate 106. The probe pins 101*e*, 101*g* and 101*i* extend in a predetermined direction, and the probe pins 101*f*, 101*h* and 101*j* extend in a direction opposite to the predetermined direction. In addition, the probe pins 101*e*, 101*f*, 101*g*, 101*h*, 101*i* and 101*j* are arranged along a direction substantially perpendicular to the extension direction in a plurality of lines respectively. FIG. 8 shows an example where the probe pins 101*e*, 101*f*, 101*g*, 101*h*, 101*i* and 101*j* of six columns and four rows are arranged with a narrow pitch.

Hereinafter, the method for manufacturing the probe card 16 according to the third embodiment will be described referring to FIGS. 8A and 8B. Hereinafter, the different part from the method for manufacturing the probe card 16 according to the second embodiment described in relation to FIG. 6 will be described mainly, and the description of the same part will be omitted partly.

Like the first step of the manufacture method shown in FIG. 2 a penetration hole 104*e* of a rectangular shape is formed in a Si substrate 102*e*, and the probe pins 101*e* and 101*f* of the plurality of probe pins are formed on the first surface of the Si substrate 102*e*. At this time, the probe pins 101*e* are formed in order that first ends of them are fixed to the first surface of the Si substrate 102*e* and second ends of them are bent in the second surface opposite to the first surface of the Si substrate 102*e* to be held freely within the penetration hole 104*e*. In addition, the probe pins 101*f* are formed in order that first ends of them are fixed to the first surface of the Si substrate 102*e* at a position facing the probe pins 101*e* to the penetration hole 104*e* and second ends of them are bent in the second surface opposite to the first surface of the Si substrate 102*e* to be held freely within the penetration hole 104*e*. Particularly, the probe pins 101*e* and the probe pins 101*f* are substantially symmetrically formed at two facing sides of the penetration hole 104*e* of a rectangular shape respectively.

In the same way, a penetration hole 104*g* together with the probe pins 101*g* and 101*h* are formed on the Si substrate 102*g*, and a penetration hole 104*i* together with the probe pins 101*i* and 101*j* are formed on the Si substrate 102*i*. Further, the penetration hole 104*g* is formed to be larger than an area of the Si substrate 102*e* where the probe pins 101*e* and 101*f* are placed, and the penetration hole 104*i* is formed to be larger than an area the Si substrate 102*g* where the probe pins 101*g* and 101*h* are placed.

Then, signal transmission lines having pin wiring patterns 108 and the pin pads 110*e*, 110*f*, 110*g*, 110*h*, 110*i* and 110*j* are formed in the base substrate 106. The base substrate 106 may be a multi-layer substrate having the pin wiring patterns 108 of a plurality of layers, and it allows the pin pads 110*e*, 110*f*, 110*g*, 110*h*, 110*i* and 110*j* and the correspondingly external terminals or contacts to be coupled with each other electrically.

Then, like the third step of the manufacture method shown in FIG. 4, the first surface of the Si substrate 102*e* is attached to the base substrate 106, and the probe pins 101*e* and 101*f* are joined to the pin pads 110*e* and 110*f* respectively. Then, after the probe pins 101*e* and 101*f* are joined with the pin pads 110*e* and 110*f*, the Si substrate 102*e* holding the probe pins 101*e* and 101*f* is eliminated by etching or mechanical peeling (first process). Then, after the Si substrate 102*e* is eliminated, the first surface of the Si substrate 102*g* is attached to the base substrate 106 in order that the probe pins 101*e* and 101*f* joined with the pin pads 110*e* and 110*f* respectively are placed within the penetration hole 104*g*, and the probe pins 101*g* and 101*h* are joined to the pin pads 110*g* and 110*h* respectively. Then, after the probe pins 101*g* and 101*h* are joined with the pin pads 110*g* and 110*h* respectively, the Si substrate 102*g* holding the probe pins 101*g* and 101*h* is eliminated by etching or mechanical peeling (second process). Then, after the Si substrate 102*g* is eliminated, the first surface of the Si substrate 102*i* is attached to the base substrate 106 in order that the probe pins 101*g* and 101*h* joined with the pin pads 110*g* and 110*h* respectively are placed within the penetration hole 104*i*, and the probe pins 101*i* and 101*j* are joined to the pin pads 110*i* and 110*j* respectively (third process).

According to the method for manufacturing the probe card 16 as above, since the probe pins of two columns can be joined with the base substrate using one Si substrate, the time for etching or the like can be reduced. Therefore, the manufacture time of the probe card 16 can be shortened, and the probe card 16 can be manufactured at a low cost.

FIG. 9 shows a method for manufacturing the probe card 16 according to a fourth embodiment. FIG. 9A is a plan view of the configuration of the probe card 16, and FIGS. 9B, 9C and 9D are plan views showing the method for manufacturing the probe card 16.

Figure 9A:
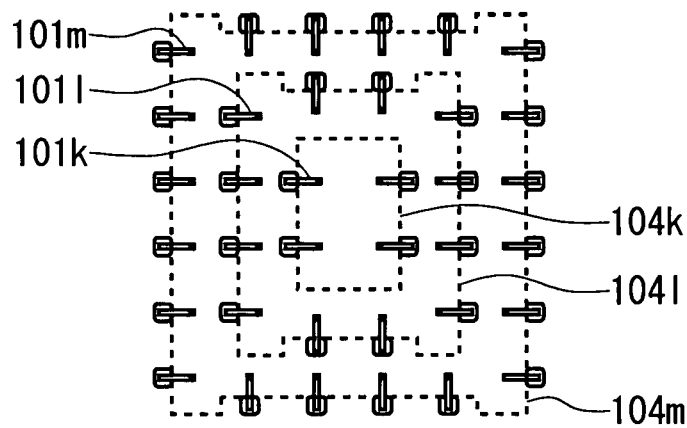
FIG. 9A is a plan view of the configuration of a probe card.

As shown in FIG. 9A, the probe card 16 of the fourth embodiment includes a plurality of probe pins 101*k*, 101*l* and 101*m* of a lattice shape arranged on the base substrate. The probe pins 101*k*, 101*l* and 101*m* extend in a direction toward a center on the base substrate. FIG. 9 shows an example where the probe pins 101*k*, 101*l* and 101*m* of six columns and six rows are arranged with a narrow pitch.

Hereinafter, the method for manufacturing the probe card 16 according to the fourth embodiment will be described referring to FIGS. 9B, 9C and 9D. Although the penetration hole of a rectangular shape is formed on the Si substrate and the probe pins are formed at the two facing sides of the penetration hole respectively in the method for manufacturing the probe card 16 according to the third embodiment described in relation to FIG. 8, the probe pins may be formed at four sides of the penetration hole respectively. In other words, the probe pins may be formed to round the penetration hole. Hereinafter, the different part from the method for manufacturing the probe card 16 according to the third embodiment described in relation to FIG. 8 will be described mainly, and the description of the same part will be omitted partly.

Figure 9B:
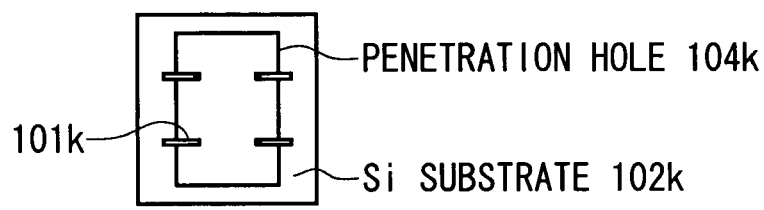
FIGS. 9B, 9C and 9D are plan views showing a method for manufacturing the probe card 16 according to a fourth embodiment.

As shown in FIG. 9B, a penetration hole 104*k* of a rectangular shape is first formed on the Si substrate 102*k*, and a plurality of probe pins 101*k* is formed on the first surface of the Si substrate 102*k*. At this time, the probe pins 101*k* are formed in order that first ends of them are fixed to the first surface of the Si substrate 102*k* and second ends of them are bent in a direction toward the second surface opposite to the first surface of the Si substrate 102*k* to be held freely within the penetration hole 104*k*. In addition, the probe pins 101*k* are formed symmetrically at two facing sides of the penetration hole 104*k* of a rectangular shape respectively.

Figure 9C:
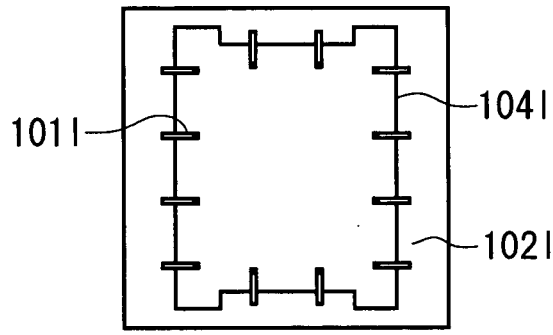

In addition, as shown in FIG. 9C, a penetration hole 104*l* of a rectangular shape is formed in a Si substrate 102*l*, and a plurality of probe pins 101*l* is formed on the first surface of the Si substrate 102*l*. At this time, the probe pins 101*l* are formed in order that first ends of them are fixed to the first surface of the Si substrate 102*l* and second ends of them are bent in a direction toward the second surface opposite to the first surface of the Si substrate 102*l* to be held freely within the penetration hole 104*l*. In addition, the plurality of probe pins 101*l* are formed at the four sides of the penetration hole 104*l* of a rectangular shape respectively.

Figure 9D:
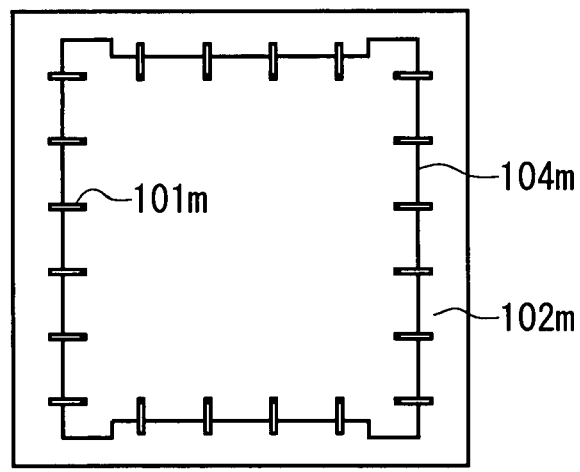

In addition, as shown in FIG. 9D, a penetration hole 104m of a rectangular shape is formed in a Si substrate 102m, and a plurality of probe pins 101m is formed on the first surface of the Si substrate 102m. At this time, the probe pins 101m are formed in order that first ends of them are fixed to the first surface of the Si substrate 102m and second ends of them are bent in a direction toward the second surface opposite to the first surface of the Si substrate 102m to be held freely within the penetration hole 104m. In addition, a plurality of probe pins 101m are formed at the four sides of the penetration hole 104m of a rectangular shape respectively.

Further, the penetration hole 104l is formed to be larger than an area where the probe pins 101k of the Si substrate 102k are placed, and the penetration hole 104m is formed to be larger than an area where the probe pins 101l of the Si substrate 102l are placed.

Then, the first surface of the Si substrate 102k is attached to the base substrate, the probe pins 101k are joined to the pin pads of the base substrate and the Si substrate 102k is eliminated by etching or mechanical peeling (first process). Then, after the Si substrate 102k is eliminated, the first surface of the Si substrate 102l is attached to the base substrate in order that the probe pins 101k are placed within the penetration hole 104l, the probe pins 101l is joined to the pin pads of the base substrate and the Si substrate 102l is eliminated by etching or mechanical peeling (second process). Then, after the Si substrate 102l is eliminated, the first surface of the Si substrate 102m is attached to the base substrate in order that the probe pins 101l are placed within the penetration hole 104m, the probe pins 101m are joined to the pin pads of the base substrate and the Si substrate 102m is eliminated by etching or mechanical peeling (third process).

According to the method for manufacturing the probe card 16 as above, since the plurality of probe pins is formed at the two or four sides of the penetration hole of the Si substrate, the Si substrate is controlled not to be shaky when combining the Si substrate and the base substrate, so that the Si substrate and the base substrate can be positioned with stability. Therefore, the probe pins and the pin pads can be positioned with high precision.

In addition, a lot of probe pins can be joined to the base substrate in one stroke so that the number of the joining processes can be reduced, and the number of elimination processes of the Si substrate can be reduced. Therefore, since the time for etching or mechanical peeling can be reduced, the manufacture time of the probe card 16 can be shortened, and the probe card 16 can be manufactured at a low cost.

Although the present invention has been described by way of exemplary embodiments, it should be understood that those skilled in the art might make many changes and substitutions without departing from the spirit and the scope of the present invention, which is defined only by the appended claims.

For example, if the interval between the probe pins is larger than the width of the Si substrate necessary to maintain the shape and strength of the Si substrate, a plurality of penetration holes may be formed in the Si substrate and the probe pins may be formed on each of the plurality of penetration holes so that more probe pins can be joined to the base substrate in one stroke. Accordingly, the manufacture time of the probe card 16 can be further reduced.

As obvious from the description above, according to the present invention, it is possible to provide a probe card having minute probe pins with high precision.

What is claimed is:

1. A method for manufacturing a probe card, which comprises a contact provided on a base substrate and electrically coupled to a terminal of an electronic device, for receiving and/or sending a signal from and/or to said electronic device, comprising:
   a first contact formation step of forming a first contact on a first surface of a first sacrificial substrate;
   a second contact formation step of forming a second contact on a first surface of a second sacrificial substrate;
   a signal transmission line formation step of forming a signal transmission line in said base substrate;
   a first contact joining step of attaching said first surface of said first sacrificial substrate to said base substrate and joining said first contact to said signal transmission line;
   a second contact joining step of attaching said first surface of said second sacrificial substrate to said base substrate and joining said second contact to said signal transmission line; and
   a first sacrificial substrate elimination step of eliminating said first sacrificial substrate after said first contact is coupled to said signal transmission line in said first contact joining step.

2. The method for manufacturing a probe card as claimed in claim 1,
   wherein after said first sacrificial substrate is eliminated in said first sacrificial substrate elimination step, said first surface of said second sacrificial substrate is attached to said base substrate and said second contact is joined to said signal transmission line in said second contact joining step.

3. The method for manufacturing a probe card as claimed in claim 1, wherein said first contact formation step comprises the steps of:
   forming a first penetration hole in said first sacrificial substrate; and
   forming a first one of said first contact in order that a first end of said first one of said first contact is fixed to said first surface of said first sacrificial substrate and a second end of said first one of said first contact is bent in a direction toward a second surface opposite to said first surface of said first sacrificial substrate to be held freely within said first penetration hole.

4. The method for manufacturing a probe card as claimed in claim 3, wherein said first contact formation step comprises a step of:
   forming a second one of said first contact in order that a first end of said second one of said first contact is fixed to said first surface of said first sacrificial substrate at a position facing said first one of said first contact to said first penetration hole and a second end of said second one of said first contact is bent in said direction toward said second surface of said first sacrificial substrate to be held freely within said first penetration hole.

5. The method for manufacturing a probe card as claimed in claim 4, wherein said first contact formation step comprises a step of:
   forming said first and second ones of said first contact to be substantially symmetrical at two facing sides of said first penetration hole formed in a rectangular shape respectively.

6. A method for manufacturing a probe card as claimed in claim 3, wherein said first contact formation step comprises a step of:
forming a plurality of said first contacts at each of four sides of said first penetration hole formed in a rectangular shape.

7. A method for manufacturing a probe card as claimed in claim 3, wherein said second contact formation step comprises the steps of:
forming a second penetration hole which is larger than an area of said first sacrificial substrate in which said first contact is placed; and
forming said second contact in order that a first end of said second contact is fixed to said first surface of said second sacrificial substrate and a second end of said second contact is bent in a direction toward a second surface opposite to said first surface of said second sacrificial substrate to be held freely within said second penetration hole, and said second joining step comprises a step of:
attaching said first surface of said second sacrificial substrate to said base substrate in order that said first contact coupled with said signal transmission line is placed within said second penetration hole and joining said second contact to said signal transmission line.

8. A method for manufacturing a probe card, which comprises a contact provided on a base substrate and electrically coupled to a terminal of an electronic device, for receiving and/or sending a signal from and/or to said electronic device, comprising:
a first contact formation step of forming a first contact on a first surface of a first sacrificial substrate, said first contact including a first end which is fixed to the first surface of the first sacrificial substrate and a second end which is freely held at the outside of the first sacrificial substrate in a direction parallel to the first surface of the first sacrificial substrate;
a second contact formation step of forming a second contact on a first surface of a second sacrificial substrate, said second contact including a third end which is fixed to the first surface of the second sacrificial substrate and a fourth end which is freely held at the outside of the second sacrificial substrate in a direction parallel to the first surface of the second sacrificial substrate;
a signal transmission line formation step of forming a signal transmission line in said base substrate;
a first contact joining step of attaching said first surface of said first sacrificial substrate to said base substrate and joining said first contact to said signal transmission line; and
a second contact joining step of attaching said first surface of said second sacrificial substrate to said base substrate and joining said second contact to said signal transmission line.

9. The method for manufacturing a probe card as claimed in claim 8, further comprising a first sacrificial substrate elimination step of eliminating said first sacrificial substrate after said first contact is coupled to said signal transmission line in said first contact joining step.

10. The method for manufacturing a probe card as claimed in claim 9, wherein after said first sacrificial substrate is eliminated in said first sacrificial substrate elimination step, said first surface of said second sacrificial substrate is attached to said base substrate and said second contact is joined to said signal transmission line in said second contact joining step.

11. The method for manufacturing a probe card as claimed in claim 8, wherein said first contact formation step comprises a step of:
forming a first one of said first contact in order that a first end of said first one of said first contact is fixed to said first surface of said first sacrificial substrate and a second end of said first one of said first contact is bent in a direction toward a second surface opposite to said first surface of said first sacrificial substrate to be held freely at the outside of the first sacrificial substrate.

12. The method for manufacturing a probe card as claimed in claim 11, wherein said first contact formation step comprises a step of:
forming a second one of said first contact in order that a first end of said second one of said first contact is fixed to said first surface of said first sacrificial substrate at a position adjacent to said first one of said first contact and a second end of said second one of said first contact is bent in said direction toward said second surface of said first sacrificial substrate to be held freely at the outside of the first sacrificial substrate.

* * * * *